United States Patent [19]
Kadah et al.

[11] Patent Number: 5,863,194
[45] Date of Patent: Jan. 26, 1999

[54] INTERROGATION OF MULTIPLE SWITCH CONDITIONS

[75] Inventors: Andrew S. Kadah, 5000 Hennaberry Rd., Manlius, N.Y. 13104; Hassan B. Kadah, Hortonville, Wis.

[73] Assignee: Andrew S. Kadah, Manlius, N.Y.; a part interest by said Hassan B. Kadah

[21] Appl. No.: 622,266

[22] Filed: Mar. 27, 1996

[51] Int. Cl.⁶ .................................................. F23N 5/00
[52] U.S. Cl. ............................... 431/24; 431/18; 331/74; 331/179
[58] Field of Search ................................ 431/24, 25, 26, 431/18; 340/825.08, 658, 635; 331/74, 179

[56] References Cited

U.S. PATENT DOCUMENTS

| | | | |
|---|---|---|---|
| 3,565,080 | 2/1971 | Ide et al. | 331/179 |
| 3,693,110 | 9/1972 | Briggs, Jr. et al. | 331/179 |
| 3,705,363 | 12/1972 | Okada et al. | 331/174 |
| 3,949,297 | 4/1976 | Hideshima . | |
| 3,949,322 | 4/1976 | Morita . | |
| 3,988,701 | 10/1976 | Funston | 331/179 |
| 4,010,447 | 3/1977 | Podowski . | |
| 4,021,756 | 5/1977 | Podowski et al. | 331/179 |
| 4,143,335 | 3/1979 | Beukers et al. | 331/179 |
| 4,375,106 | 2/1983 | Voll . | |
| 4,495,485 | 1/1985 | Smith . | |
| 4,923,117 | 5/1990 | Adams et al. | 431/24 |
| 5,014,051 | 5/1991 | Lippmann et al. | 340/870.38 |
| 5,074,780 | 12/1991 | Erdman | 431/24 |
| 5,085,574 | 2/1992 | Wilson | 431/6 |
| 5,506,569 | 4/1996 | Rowlette | 431/24 |
| 5,586,174 | 12/1996 | Bogner et al. | 340/533 |
| 5,625,325 | 4/1997 | Rotzoll et al. | 331/179 |

FOREIGN PATENT DOCUMENTS

| | | | |
|---|---|---|---|
| 2082360 | 3/1982 | United Kingdom | 431/24 |

OTHER PUBLICATIONS

Electronic Circuits Manual, John Markus, McGraw–Hill, Inc., pp. 617 and 927, 1971.

*Primary Examiner*—Carl D. Price
*Attorney, Agent, or Firm*—Trapani & Molldrem

[57] ABSTRACT

Arrangement for interrogating multiple switch conditions employs a single input microprocessor for a plurality of switch elements that are coupled in series with an operating element and a power source. A variable oscillator has a control input and an output coupled to the microprocessor input, providing a periodic signal to the same. A plurality of impedance elements, e.g., resistors, each with a respective value, are coupled between a respective junction between two successive switch elements and the control input of said variable oscillator, such that the rate of said periodic signal varies as a function of the open or closed condition of the respective switch elements. For each switch being tested, the microprocessor looks for one predetermined frequency or pulse rate corresponding to an open condition and another corresponding to a closed condition. The switches can be tested to ensure that they both close and open when directed, and to ensure that none of the switches is locked or frozen into a closed condition. If a given switch does not behave as it is supposed to, a service light will come on to indicate the problem.

10 Claims, 3 Drawing Sheets

INTERROGATION OF MULTIPLE SWITCH CONDITIONS

BACKGROUND OF THE INVENTION

The present invention relates to control circuits, e.g., furnace controls, and is more particularly concerned with a control circuit that automatically interrogates the open/closed condition of a multiple of switches that are connected in series. The invention is more specifically concerned with a control circuit that interrogates multiple switch conditions using a single input microprocessor.

In a modern gas furnace, one or more gas burners inject a gas flame through a heat exchanger, and the combustion gases are drawn out the heat exchanger by means of an inducer blower, which exhausts the combustion gases to a vent or flue. A pressure sensor associated with the inducer actuates a pressure switch to indicate a pressure differential between the exhaust and intake of the inducer. The pressure switch provides an indication that the inducer is functioning properly.

An indoor air blower forces air from a comfort zone past the heat exchanger to draw heat from the combustion gases. The warmed air is then returned to the comfort zone. A temperature limit switch on the heat exchanger is normally closed, and opens if the heat exchanger exceeds a predetermined temperature. This limit switch serves as a check on proper air flow and functioning of the indoor air blower.

A thermostat located in the comfort zone closes when the room temperature drops below a predetermined setpoint, and thereby signals a call for heat. When a call for heat is detected, control and timing circuitry for the furnace actuates the inducer blower and then actuates a combustion sequence so that current is supplied to a gas valve. This allows combustion gas to flow to the burners. At this time, igniters are actuated to light the burners, and the furnace begins to produce heat. An infrared detector, rectification, or other mechanism is employed to ensure that there is flame after the gas valve is actuated.

After the burners have been ignited for a predetermined time, the room air blower is powered up, and this creates a flow of warm air to the interior comfort zone.

Conventionally, 24 volt ac thermostat power is supplied through the series arrangement of the limit switch, thermostat, pressure switch, gas valve relay, and gas valve. Optionally, a pilot relay can actuate a line-powered gas valve relay.

As aforementioned, the limit switch, thermostat, and pressure switch are all disposed in series with the gas valve relay, so that no current can flow through the gas valve relay to actuate the gas valve, until the limit switch and pressure switch are both closed. This serves as a check that the room air blower and the inducer blower are functioning properly.

A safety problem can arise if any of the limit switch, pressure switch, or gas valve relay are for some reason locked into a closed condition. In those cases, the gas valve will continue to feed gas to the burners if the heat exchanger experiences overtemperature, or if the inducer fails to produce sufficient draft.

In a modern furnace control unit, a microprocessor circuit has respective inputs connected to the series switches, with a separate microprocessor input coupled to the junction between each switch and the next successive switch or operating element. A control system of this type is described in Erdman U.S. Pat. No. 5,074,780. This type of control demands that, for each switch, the microprocessor requires a separate input circuit. As the cost of the microprocessor depends on the number of input circuits that are needed, the cost of the control circuit can become great. Also, a failure of any one of the input circuits can prevent the device from detecting a switch malfunction or failure condition.

Generally, whenever there is a call for heat, the controller should be able to check the conditions of the pressure switch and the gas valve relay before supplying current to the coil for the gas valve relay. This permits the control circuit to check for switch malfunction and indicate a service condition, if service or repair is required. In the conventional system, each switch has a connection to an associated input. As each switch goes from an open to a closed condition, the respective microprocessor input circuit goes from a low to a high level. Thus when there is a call for heat, the input circuit associated with the thermostat goes to a high, and the microprocessor then is alerted to turn on the inducer blower. This pressure switch closes after the inducer creates a pressure differential, and the associated microprocessor input goes from low to high. Then the gas valve relay is actuated, and the microprocessor input associated with the gas valve relay goes from low to high. This arrangement permits a positive check that the pressure switch and gas valve relay can both open and close.

As aforesaid, the microprocessor requires a separate input circuit for each switch. Thus if additional switch conditions are also to be tested, a microprocessor with more input circuits is required.

OBJECTS AND SUMMARY OF THE INVENTION

It is an object of this invention to provide an arrangement for interrogating multiple switch conditions for switch elements joined in series, and which avoids the drawbacks of the prior art.

It is a more specific object to provide an arrangement for interrogating multiple switches which employs only a single input circuit of the control microprocessor.

It is a related object to provide an arrangement in which the same microprocesssor can be employed where the control circuit interrogates additional elements.

According to an aspect of this invention, an arrangement is provided for interrogating multiple switch conditions for a plurality of switch elements in series with an operating element and a power source, and which requires only a single input circuit of a microprocessor.

The successive switch elements and operating elements define respective junctions between them. A variable oscillator has a control input and an output coupled to the microprocessor input. There are respective impedances, e.g., resistors, each with a respective impedance value, coupled between an associated one of the junctions and the control input of the variable oscillator. The rate of the periodic signal generated by the variable oscillator varies as a function of the closed or open condition of the switch elements. The periodic signal is applied to the microprocessor input, and the microprocessor is programmed to sense the various switch conditions based on the rate of the signal at the microprocessor input.

As only a single microprocessor input circuit is needed, the same microprocessor can be used for a larger or smaller number of switch interrogations.

In this invention, rather than having a multiple input microprocessor with each input being associated with a respective switch, the arrangement employs a microprocessor which has only the one input, and for each switch being tested the microprocessor looks for some predetermined frequency or pulse rate. Each switch has an associated resistor, which can be, in effect, shunted when the associated switch is closed. The resistors are coupled to an active oscillator element and also to a capacitor. The oscillator frequency changes depending upon which switch is open or closed. The switches can each be tested for off and on conditions, i.e., to see if they are locked closed or to see if they will open and close when called to do so. Switch closure changes the pulse rate of the oscillator, and the microprocessor senses whether a given pulse rate is present or not, and can determine the switch condition accordingly. If the switch does not behave as it is supposed to, a service-required light or LED turns on, and a service technician will be able to identify the problem based on the condition of the lights or LEDs.

The above and many other objects, features, and advantages of this invention will present themselves to persons skilled in the art from the ensuing detailed description of a preferred embodiment of the invention, which should be read in connection with the accompanying Drawing.

DETAILED DESCRIPTION OF THE PREFERRED EMBODIMENT

Figure 1:
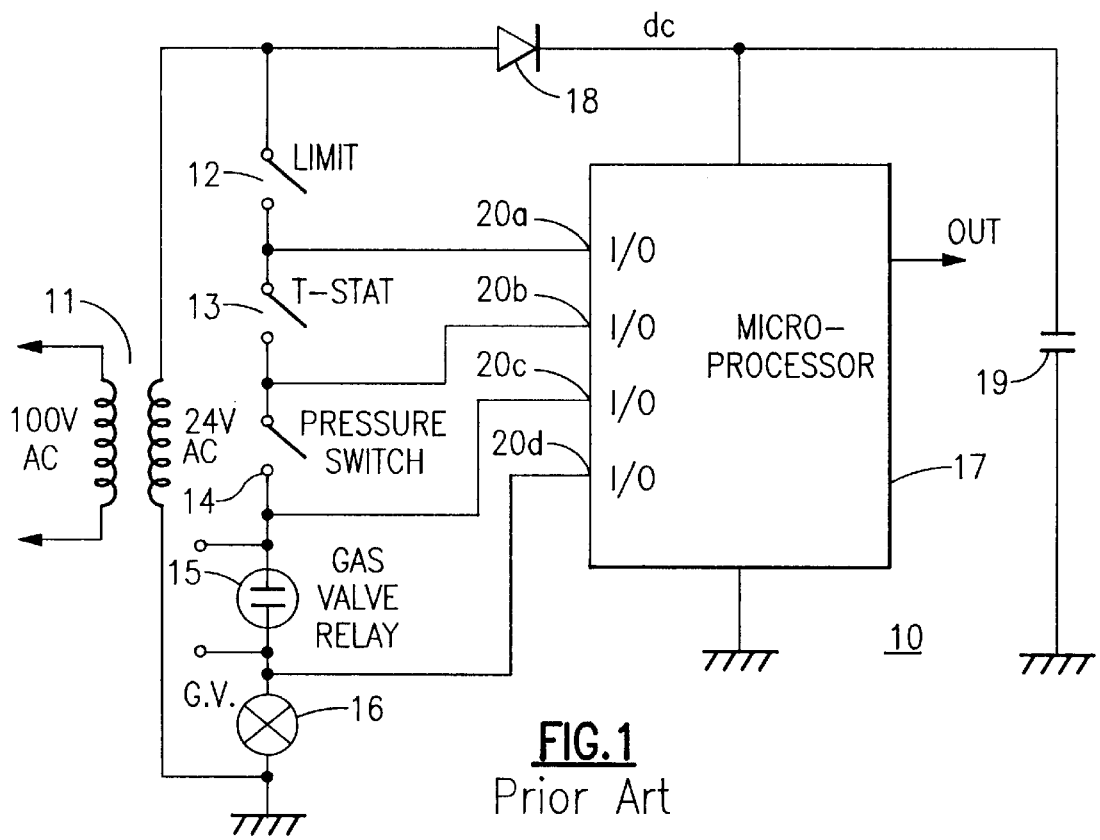
FIG. 1 is a block diagram of a microprocessor-based control circuit according to the prior art.

With reference to the Drawing, FIG. 1 illustrates a multiple switch control arrangement 10 for a gas furnace. A transformer 11 provides 24-volt ac thermostat power to a limit switch 12, a thermostat switch 13, a pressure switch 14, a gas valve relay 15, and a gas valve 16, which are all connected in series. A microprocessor control circuit 17 is formed as an integrated circuit and derives dc power from a rectifier 18 that is tied to the 24-volt thermostat power, and which has an associated smoothing capacitor 19. A plurality of input circuits, or I/Os 20a, 20b, 20c, and 20d are respectively tied to the junctions formed between the limit switch 12 and the thermostat switch 13, the thermostat switch 13 and the pressure switch 14, the pressure switch and the gas valve relay 15, and the gas valve relay and the gas valve 16. As the switches 12, 13, 14, and 15 close in order, the level changes at each of the I/Os 20a, 20b, 20c, and 20d, with a low indicating an open switch condition and a high indicating a switch closure. With this arrangement, the microprocessor 17 needs to have at least as many input circuits as there are switches to monitor.

The multiplicity of input circuits makes the microprocessor more complex and hence more expensive. Also, it is difficult to distinguish between a switch malfunction and a failure of one of the input circuits 20a to 20d.

Figure 2:
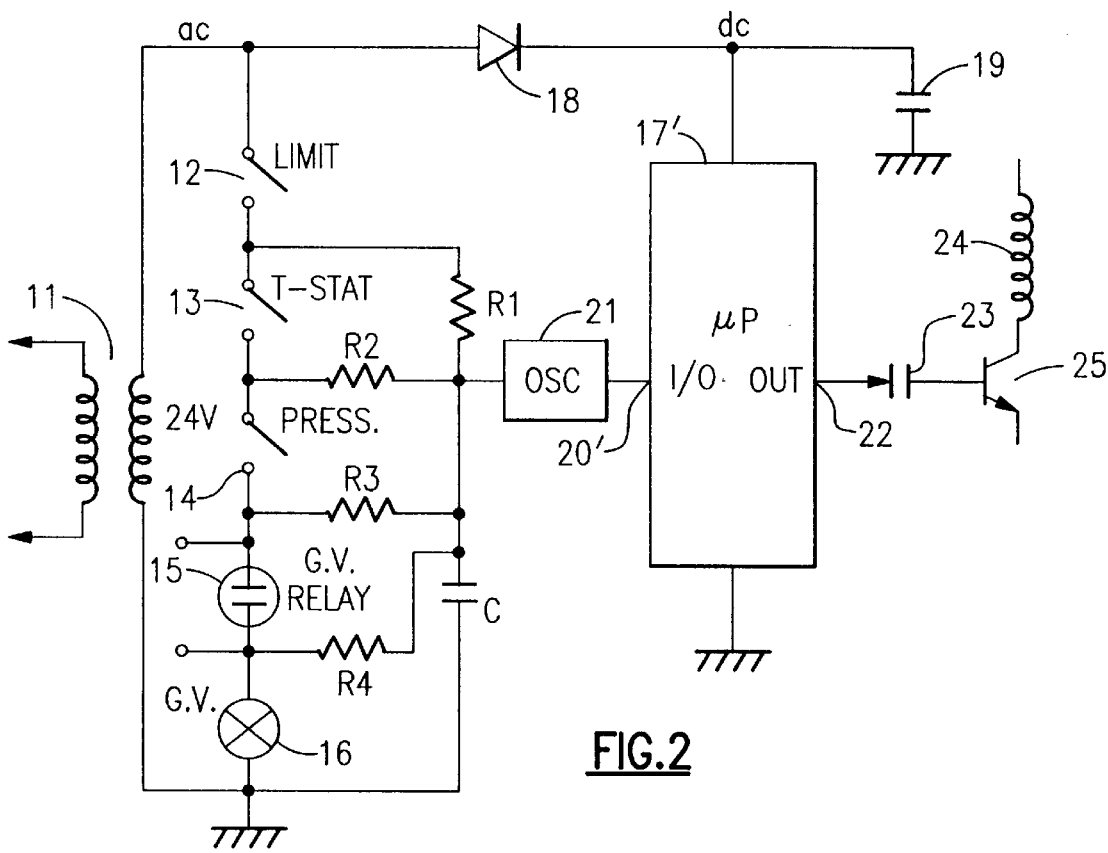
FIG. 2 is a block diagram of a control circuit according to an embodiment of the invention.

A multiple switch control arrangement 10' according to an embodiment of this invention is shown schematically in FIG. 2. Here, elements that correspond to similar elements described with reference to FIG. 1 are identified with the same reference characters, except that where the element is varied in form, the reference character carries a prime. In this embodiment, the microprocessor 17' employs a single input circuit 20' to detect and interrogate the status of the multiple switches 12, 13, 14, and 15. There are respective resistors R1, R2, R3, and R4, each having one end coupled to the junctions between the limit switch 12, the thermostat switch 13, the pressure switch 14, the gas valve relay 15, and the gas valve 16. The other ends of the resistors R1, R2, R3, and R4 are also coupled to a variable oscillator circuit 21, and through a timing capacitor C to a common or ground. The output of the oscillator circuit 21 is tied to the microprocessor input 20'. The resistors have respective different values, and are shunted as each successive switch 12, 13, 14, 15 closes. Thus, the open and closed status of each of the switches corresponds to a respective different pulse frequency. The microprocessor looks for the specific pulse rate or frequency for each switch when that switch is interrogated, and can determine whether the switch opens or closes as it is intended to do. The presence or absence of a particular pulse rate verifies the status of each respective switch. As only a single input circuit is employed, failure of the input circuit cannot be mistaken for switch failure, unless all switches experience misoperation simultaneously.

As also shown in FIG. 2, an output 22 of the microprocessor 17' supplies an output signal, e.g., pulsating dc, through an output capacitor 23 to the base of an NPN transistor, whose collector supplies current to a relay coil 25, e.g., the actuator coil for the gas valve relay or for the inducer fan relay. This arrangement serves as a fail-safe circuit, and will actuate the associated relay only if the output 22, the capacitor 23, the transistor 24 and the coil 25 are all functioning properly. In the event that the output 22 is locked high, the capacitor 23 is either shorted or open, or the transistor 25 fails, current will not flow into the coil 24, and the associated relay will not close. This arrangement satisfies first order failure mode effect criticality analysis (First Order FMECA).

Figure 3A:
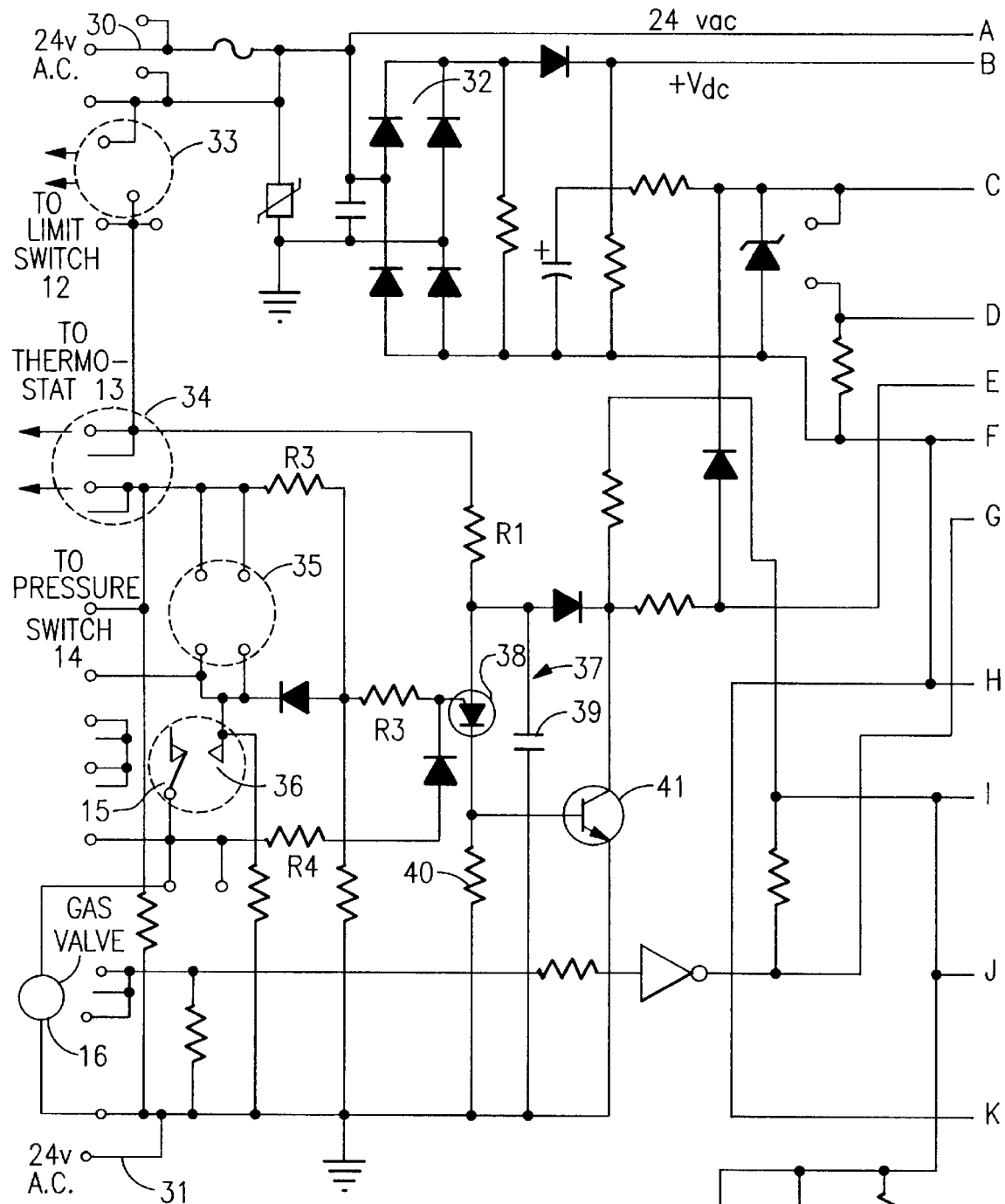
FIG. 3, formed of FIGS. 3A and 3B, is a detailed circuit diagram of an embodiment of this invention.
Figure 3:
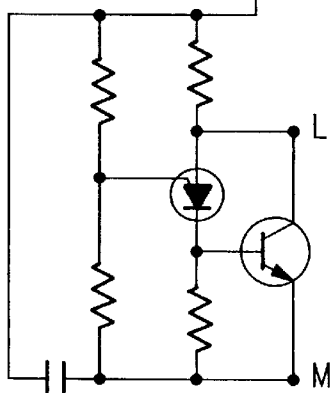
Figure 3B:
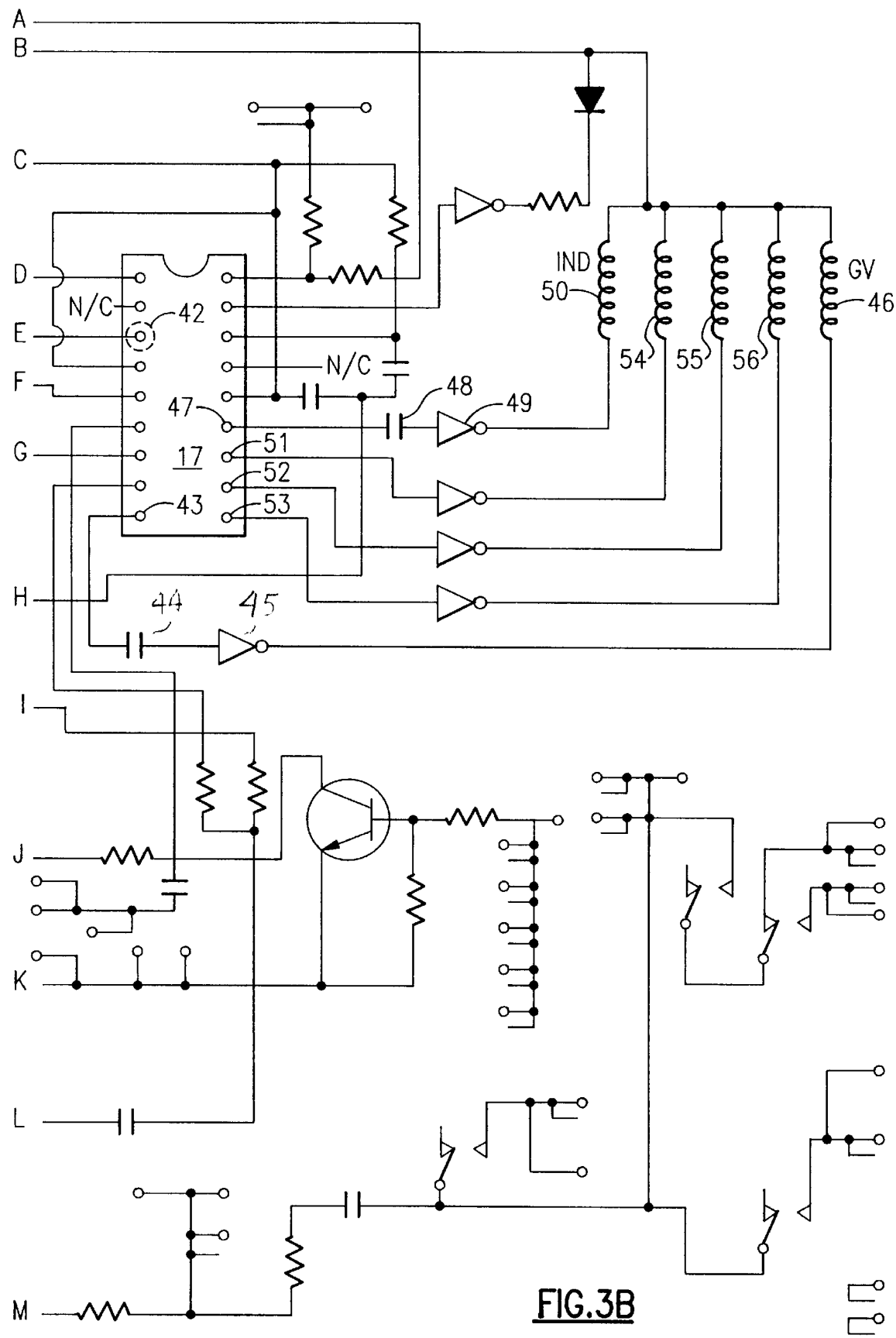

Circuit details of the control circuit of an embodiment of the present invention are shown in FIG. 3, which is formed by joining FIGS. 3A and 3B. The circuit conductors as shown are to be joined at points A—A to M—M.

As illustrated, ac inputs 30 and 31 are coupled to receive the 24 volt ac thermostat power. A rectifier circuit 32, here shown as a full wave bridge, is tied to the ac inputs and provides dc power to the microprocessor 17. The ac power is coupled from the ac input 30 to a first coupling 33 that is connected to the limit switch 12, and this in turn is connected to a second coupling that is connected to the thermostat 13. A third coupling 35 connects to the pressure switch 14, and this is followed by the normally-open contact 36 of the gas valve relay 15. The contactor blade of the relay 15 supplies current to the gas valve 16, which in turn is connected to the ac input 31. The ac input 31 here serves as circuit ground. As can be appreciated, the limit switch 12, the thermostat 13, the pressure switch 14, the gas valve relay 15 and the gas valve 16 are all disposed in series between the ac input 30 and the ac input 31. Resistance R1 is tied at one end to the junction of the couplings 33 and 34, resistance R2 is tied at one end to the junction between couplings 34 and 35, and resistance R3 is tied at one end, through a diode, to the junction between the normally open contact 36 of the gas valve relay 15 and the coupling 35. The fourth resistance R4 is tied at one end to the contactor blade of the gas valve relay, which is coupled to the gas valve 16.

A relaxation oscillator 37 is formed by a programmable unijunction transistor or PUT 38, with the resistance R1 connected to the anode thereof. The resistances R2, R3, and R4 are coupled to the gate electrode of the PUT 38. A timing capacitor 39 is coupled between the PUT anode and ground, and a cathode resistor 40 is disposed between the PUT cathode and ground. In this embodiment, each of the resistances has a different respective value, for example, 1 K, 2.2 K, 3.3 K and 4.7 K, respectively. The various resistors are shunted as each of the respective switch elements closes, so that for each switch condition the relaxation oscillator 37 will have a unique time constant, and hence frequency. Thus the status of each switch corresponds to the presence of a signal at a predetermined pulse rate.

The cathode of the PUT 38 is coupled through an amplifying transistor 41 to an input pin 42 of the microprocessor 17. The microprocessor interrogates the switch elements for open and closed conditions by looking for pulse rates or frequencies at the appropriate times. If the pulses are detected at the correct rate, then the microprocessor verifies that the switch in question is open or closed, and the microprocessor 17 continues its protocol. If the pulses arrive at an incorrect rate, or are absent, then the microprocessor 17 indicates an error condition, and shuts off the furnace protocol.

It should be apparent that a more complex series circuit, with additional switch elements and respective additional resistances, would also employ only the single input pin 42. In that case, the microprocessor would interrogate the status of the additional switches by detecting the presence or absence of other respective pulse rates.

As further shown in FIG. 3, the microprocessor has an output 43 that produces a pulse signal to actuate the gas valve 16. Here, the output 43 is coupled through a capacitor 44 to the base electrode of an inverter transistor 45 whose collector is joined to an actuator coil 46 for the gas valve relay 15. Similarly, another microprocessor output 47 is coupled through a capacitor 48 to the base electrode of an inverter transistor 49 whose collector is joined to an actuator coil 50 for the inducer motor relay. This arrangement provides the inducer and the gas valve with first order failure mode protection, as discussed above with respect to FIG. 2. The microprocessor 17 can actuate the gas valve relay only if the output 43, the capacitor 44, the transistor 45 and the coil 46 are all functioning properly. Similarly, the microprocessor can actuate the inducer blower only if the output 47, the capacitor 48, the transistor 49 and the coil 50 are in proper condition. A failure of any one of these parts will result in a fail-safe condition in which the gas valve or the inducer cannot be turned on. In either event, the microprocessor will be able to detect this condition, by action of the relaxation oscillator 37, and the microprocessor will ignite a trouble light to indicate the nature of the problem.

Here additional outputs 51, 52, and 53 of the microprocessor 17 are tied to actuator coils 54, 55, and 56, which can actuate the indoor air blower, an indoor/outdoor air economizer, humidifier, or other equipment associated with the furnace. Other miscellaneous and ancillary circuitry shown in FIG. 3 can be associated with controls for a central air conditioning unit or heat pump.

As used in the description and claims, the term "switch" includes not only on-off devices, but any other means that effectively changes its impedance value in response to a stimulus.

While the invention has been described here in reference to a preferred embodiment, it should be recognized that the invention is not limited to that embodiment. Rather, many modifications and variations will present themselves to persons skilled in the art without departure from the scope and spirit of this invention, as defined in the appended claims.

We claim:

1. Arrangement for interrogating multiple switch conditions with a single input microprocessor wherein a plurality of switch elements are coupled in series with an operating element and a power source, with respective junctions being defined between successive ones of said switch elements and said operating element; comprising:

a microprocessor control element having an input and an output;

variable oscillator means having a control input and an output coupled to said microprocessor control element input, providing a periodic signal to said input; and a plurality of impedance elements each having a respective predetermined impedance value and being coupled between an associated one of said junctions and the control input of said oscillator means, such that the rate of said periodic signal varies as a function of the open or closed condition of said switch elements.

2. Arrangement for interrogating multiple switch conditions according to claim 1, wherein said variable oscillator means includes a relaxation oscillator coupled to said impedance elements.

3. Arrangement for interrogating multiple switch conditions according to claim 2, wherein said relaxation oscillator includes a PUT, said impedances, and a timing capacitor.

4. Arrangement for interrogating multiple switch conditions according to claim 1, wherein said plurality of switch elements are associated with a gas furnace of the type having at least one gas valve, a heat exchanger, and an inducer for inducing an air flow through said heat exchanger, and said switch elements include a thermal limit switch sensitive to a temperature limit on said heat exchanger, a thermostat switch which closes if there is a call for heat, a pressure switch which closes if said inducer is operating correctly but opens otherwise, and a gas valve relay which is actuated by said microprocessor to actuate the gas furnace, and said plurality of impedance elements include a first resistor coupled to a junction between said limit switch and said thermostat switch, a second resistor coupled to a junction between said thermostat switch and said pressure switch, and a third resistor coupled to a junction between said pressure switch and said gas valve relay.

5. Arrangement for interrogating multiple switch conditions according to claim 4, wherein said plurality of impedance elements further comprises a fourth resistor coupled to a junction between said gas valve relay and a subsequent element in series therewith.

6. A fail-safe thermostat control arrangement for actuating a gas valve relay of a gas furnace, comprising a plurality of switch elements connected in series with one another and with a gas valve and a power source so that the gas valve is not actuated unless all of said switch elements are closed, and with respective junctions being defined between successive ones of said switch elements and said gas valve; comprising a microprocessor control element having an input and an output;

variable oscillator means having a control input and an output coupled to said microprocessor control element input, providing a periodic signal to said input;

a plurality of resistive elements each having a respective predetermined resistance value and being coupled between an associated one of said junctions and the control input of said oscillator means, such that the rate of said periodic signal varies as a function of the open or closed condition of said switch elements; and a gas valve relay element, coupled to said microprocessor control element output, for controllably actuating said gas valve.

7. A fail-safe thermostatic control arrangement according to claim 6, wherein said plurality of switch elements are associated with a gas furnace of the type having a heat exchanger and an inducer for inducing an air flow through said heat exchanger, and said switch elements include a thermal limit switch sensitive to a temperature limit on said heat exchanger, a thermostat switch which closes if there is a call for heat, and a pressure switch which closes if said inducer is operating correctly but opens otherwise, and said plurality of resistance elements include a first resistor coupled to a junction between said limit switch and said thermostat switch, a second resistor coupled to a junction between said thermostat switch and said pressure switch, and a third resistor coupled to a junction between said pressure switch and said gas valve relay.

8. A fail-safe thermostatic control arrangement according to claim 7, wherein said plurality of resistance elements further comprises a fourth resistor coupled to a junction between said gas valve relay and a subsequent element in series therewith.

9. A fail-safe thermostatic control arrangement according to claim 6, further comprising a timing capacitor coupled between an input of said variable oscillator means and a point of reference potential.

10. A fail-safe thermostat control arrangement for actuating a gas valve relay of a gas furnace, comprising a plurality of switch elements connected in series with one another and with a gas valve and an AC power source so that the gas valve is not actuated unless all of said switch elements are closed, and with respective junctions being defined between successive ones of said switch elements and said gas valve; comprising a microprocessor control element having an input and an output;

variable oscillator means having a control input and an output coupled to said microprocessor control element input, providing a periodic signal to said input;

a plurality of impedance elements each having a respective predetermined impedance value and being coupled between an associated one of said junctions and the control input of said oscillator means, such that the rate of said periodic signal varies as a function of the open or closed condition of said switch elements; and a gas valve relay element, coupled to said microprocessor control element output, for controllably actuating said gas valve.

* * * * *